US009299567B2

United States Patent
Mizukami et al.

(10) Patent No.: US 9,299,567 B2
(45) Date of Patent: Mar. 29, 2016

(54) MANUFACTURING METHOD OF MIS-TYPE SEMICONDUCTOR DEVICE, INCLUDING HEATING A ZIRCONIUM OXYNITRIDE (ZRON) LAYER

(71) Applicant: TOYODA GOSEI CO., LTD., Kiyosu-shi (JP)

(72) Inventors: Kiyotaka Mizukami, Kiyosu (JP); Takahiro Sonoyama, Kiyosu (JP); Toru Oka, Kiyosu (JP); Junya Nishii, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 0 days.

(21) Appl. No.: 14/171,633

(22) Filed: Feb. 3, 2014

(65) Prior Publication Data

US 2014/0287572 A1    Sep. 25, 2014

(30) Foreign Application Priority Data

Mar. 25, 2013    (JP) .................................. 2013-61476

(51) Int. Cl.
*H01L 29/20* (2006.01)
*H01L 21/28* (2006.01)
*H01L 29/51* (2006.01)
*H01L 29/49* (2006.01)

(52) U.S. Cl.
CPC ........ *H01L 21/28264* (2013.01); *H01L 29/513* (2013.01); *H01L 29/517* (2013.01); *H01L 29/2003* (2013.01); *H01L 29/4966* (2013.01)

(58) Field of Classification Search
CPC ..................... H01L 21/28097; H01L 29/4975; H01L 29/7833; H01L 29/517; H01L 21/8234
USPC ........................... 257/105, 410; 438/502, 509
See application file for complete search history.

(56) References Cited

U.S. PATENT DOCUMENTS

2009/0242957 A1*  10/2009  Ma et al. ........................ 257/316
2012/0032227 A1*   2/2012  Seabaugh et al. ............. 257/105
2012/0256276 A1*  10/2012  Hwang et al. ................. 257/410

FOREIGN PATENT DOCUMENTS

JP           2010-10199 (A)           1/2010

* cited by examiner

*Primary Examiner* — Evan Pert
*Assistant Examiner* — Changhyun Yi
(74) *Attorney, Agent, or Firm* — McGinn IP Law Group, PLLC

(57) ABSTRACT

A manufacturing method of MIS (Metal Insulator Semiconductor)-type semiconductor device includes the steps of: forming a zirconium oxynitride (ZrON) layer; forming an electrode layer containing titanium nitride (TiN) on the zirconium oxynitride (ZrON) layer; and heating the electrode layer.

17 Claims, 14 Drawing Sheets

Fig.3

<EXECUTION OR NON-EXECUTION OF SECOND
ANNEALING AND THIRD ANNEALING WITH RESPECT TO SAMPLES>

| | | SECOND ANNEALING | THIRD ANNEALING | |
|---|---|---|---|---|
| GaN SUBSTRATE | SAMPLE 1 | ○ | ○ | (EXAMPLE) |
| | SAMPLE 2 | × | ○ | (EXAMPLE) |
| | SAMPLE 3 | ○ | × | (COMPARATIVE EXAMPLE) |
| | SAMPLE 4 | × | × | (COMPARATIVE EXAMPLE) |

RESULTS OF CV MEASUREMENT (SAMPLE 1)

(THRESHOLD VOLTAGE)

(THRESHOLD VOLTAGE)

RESULTS OF CV MEASUREMENT (SAMPLE 2)

RESULTS OF CV MEASUREMENT (SAMPLE 3)

RESULTS OF CV MEASUREMENT (SAMPLE 4)
Fig.7A
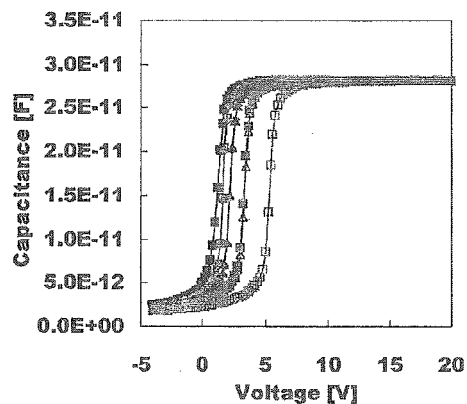
Fig.7B
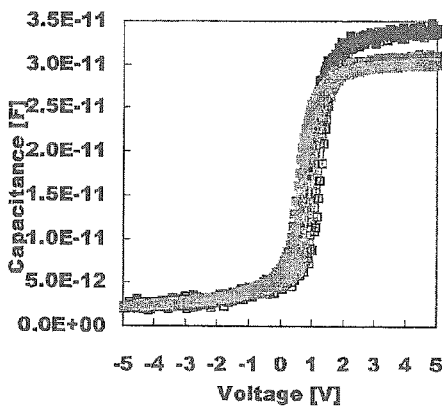
Fig.8
SECOND EXAMPLE
<EXECUTION OR NON-EXECUTION OF SECOND
ANNEALING AND THIRD ANNEALING WITH RESPECT TO SAMPLES>
|  |  | SECOND ANNEALING | THIRD ANNEALING |  |
|---|---|---|---|---|
| GaN SUBSTRATE | SAMPLE 5 | × | ○ | (EXAMPLE) |

SECOND EXAMPLE

RESULTS OF CV MEASUREMENT
(SAMPLE 5: THIRD ANNEALING 700°C)

Fig.10

THIRD EXAMPLE

<EXECUTION OR NON-EXECUTION OF SECOND
ANNEALING AND THIRD ANNEALING WITH RESPECT TO SAMPLES>

| | | SECOND ANNEALING | THIRD ANNEALING | |
|---|---|---|---|---|
| n⁻ Si SUBSTRATE | SAMPLE 6 | ○ | ○ | (EXAMPLE) |
| | SAMPLE 7 | × | ○ | (EXAMPLE) |
| | SAMPLE 8 | ○ | × | (COMPARATIVE EXAMPLE) |
| | SAMPLE 9 | × | × | (COMPARATIVE EXAMPLE) |

THIRD EXAMPLE

RESULTS OF CV MEASUREMENT (SAMPLE 6)

THIRD EXAMPLE
RESULTS OF CV MEASUREMENT (SAMPLE 7)

THIRD EXAMPLE
RESULTS OF CV MEASUREMENT (SAMPLE 8)

THIRD EXAMPLE
RESULTS OF CV MEASUREMENT (SAMPLE 9)

MANUFACTURING METHOD OF MIS-TYPE SEMICONDUCTOR DEVICE, INCLUDING HEATING A ZIRCONIUM OXYNITRIDE (ZRON) LAYER

CROSS REFERENCE TO RELATED APPLICATIONS

The present application claims the priority based on Japanese Paten Application No. 2013-61476 filed on Mar. 25, 2013, the disclosure of which is hereby incorporated by reference in its entirety.

BACKGROUND OF THE INVENTION

1. Technical Field

The present invention relates to an MIS-type semiconductor device.

2. Description of the Related Art

MIS (Metal Insulator Semiconductor)-type semiconductor devices having the three-layer structure of a metal (electrode), an insulator and a semiconductor (substrate) have conventionally been used as semiconductor devices (for example, JP 2010-10199A). Accompanied with the recent demands for the high-speed operation and the low power consumption, MIS-type semiconductor devices including a combination of a high dielectric constant (high-k) insulating film and a metal layer have been used. For example, zirconium oxynitride (ZrON) is used for the high-k insulating film.

SUMMARY OF THE INVENTION

The conventional MIS-type semiconductor device, however, problems of a variation in voltage at which the capacitance of the MIS-type semiconductor device abruptly increases (hereinafter referred to as "threshold voltage") and a variation in maximum capacitance with a change in frequency of applied voltage (operation voltage) and a change in range of the applied voltage. For example, when the MIS-type semiconductor device is used for a transistor, the unstable threshold voltage may cause application of an identical gate voltage to result in an ON operation in some cases but in an OFF operation in other cases. This causes unstable operation of the semiconductor device. The variation in maximum capacitance of the MIS-type semiconductor device leads to a variation in power consumption of the semiconductor device, thus causing unstable operation of the semiconductor device. There is accordingly a demand for technology that improves the operation stability of the MIS-type semiconductor device. There are also demands for easiness of manufacturing and resource saving in the conventional manufacturing method of the MIS-type semiconductor device.

In order to solve at least part of the problems described above, the invention may be implemented by the following aspects.

(1) According to one aspect, there is provided a manufacturing method of an MIS (Metal Insulator Semiconductor)-type semiconductor device. The manufacturing method of an MIS-type semiconductor device includes the steps of; forming a zirconium oxynitride (ZrON) layer; forming an electrode layer containing titanium nitride (TiN) on the zirconium oxynitride (ZrON) layer; and heating the electrode layer. The manufacturing method of the MIS-type semiconductor device according to this aspect suppresses a variation in voltage at which the capacitance of the MIS-type semiconductor device abruptly increases (threshold voltage), irrespective of the different voltage range where the applied voltage to the MIS-type semiconductor device is changed and the different direction of such a change. The manufacturing method of this aspect also suppresses a variation in threshold voltage, irrespective of the different frequency of the applied voltage. Accordingly, this improves the operation stability of the MIS-type semiconductor device. The MIS-type semiconductor device herein is not limited to MISFET (Metal Insulator Semiconductor Field Effect Transistor) but has a broader meaning including, for example, a layered product consisting of a substrate, a zirconium oxynitride layer and an electrode layer, where neither a source electrode nor a drain electrode is formed, and the electrode layer is usable as a gate electrode.

(2) In the manufacturing method of the MIS-type semiconductor device according to above described aspects, further includes forming a silicon (Si)-containing layer on a substrate, prior to the step of forming a zirconium oxynitride (ZrON) layer, wherein the step of forming a zirconium oxynitride (ZrON) layer forms the zirconium oxynitride (ZrON) layer on the silicon (Si)-containing layer. According to the manufacturing method of the MIS-type semiconductor device of this aspect, an insulating layer of the MIS-type semiconductor device consists of the zirconium oxynitride (ZrON) layer and the silicon (Si)-containing layer.

(3) In the manufacturing method of the MIS-type semiconductor device according to above described aspects, the step of heating the electrode layer heats the electrode layer at a temperature that is equal to or higher than 400 degrees Celsius and equal to or lower than 1000 degrees Celsius. The manufacturing method of the MIS-type semiconductor device of this aspect more effectively suppresses a variation in threshold voltage of the MIS-type semiconductor device.

(4) In the manufacturing method of the MIS-type semiconductor device according to above described aspects, further includes the step of. heating the zirconium oxynitride (ZrON) layer, after the step of forming a zirconium oxynitride (ZrON) layer and prior to the step of forming an electrode layer containing titanium nitride (TiN) on the zirconium oxynitride (ZrON) layer. The manufacturing method of the MIS-type semiconductor device of this aspect suppresses a variation in maximum capacitance of the MIS-type semiconductor device, irrespective of the different frequency of the applied voltage. Accordingly, this improves the operation stability of the MIS-type semiconductor device.

(5) In the manufacturing method of the MIS-type semiconductor device according to above described aspects, the step of heating the zirconium oxynitride (ZrON) layer heats the zirconium oxynitride (ZrON) layer at a temperature that is equal to or higher than 400 degrees Celsius. The manufacturing method of the MIS-type semiconductor device of this aspect more effectively suppresses a variation in maximum capacitance of the MIS-type semiconductor device.

(6) In the manufacturing method of the MIS-type semiconductor device according to above described aspects, further includes the step of: forming a silicon (Si)-containing layer on a substrate, prior to the step of forming a zirconium oxynitride (ZrON) layer, wherein the substrate contains gallium nitride (GaN). The manufacturing method of the MIS-type semiconductor device of this aspect improves the operation stability of the MIS-type semiconductor device using the GaN-containing substrate.

(7) In the manufacturing method of the MIS-type semiconductor device according to above described aspects, further includes the steps of: forming a silicon (Si)-containing layer on a substrate, prior to the step of forming a zirconium oxynitride (ZrON) layer; and heating the silicon (Si)-containing layer, after the step of forming a silicon (Si)-containing layer on a substrate and prior to the step of forming a zirconium oxynitride (ZrON) layer. The manufacturing method of the MIS-type semiconductor device of this aspect more effectively suppresses a variation in threshold voltage of the MIS-type semiconductor device. This also more effectively suppresses both a variation in threshold voltage and a variation in maximum capacitance of the MIS-type semiconductor device.

(8) In the manufacturing method of the MIS-type semiconductor device according to above described aspects, the step of heating the silicon (Si)-containing layer heats the silicon (Si)-containing layer at a temperature that is equal to or higher than 400 degrees Celsius. The manufacturing method of the MIS-type semiconductor device of this aspect more effectively suppresses a variation in threshold voltage of the MIS-type semiconductor device. This also more effectively suppresses both a variation in threshold voltage and a variation in maximum capacitance of the MIS-type semiconductor device.

(9) In the manufacturing method of the MIS-type semiconductor device according to above described aspects, the MIS-type semiconductor device is used for electric power control. The manufacturing method of the MIS-type semiconductor device according to any of the above aspects suppresses a variation in threshold voltage even under the condition of a relatively high applied voltage. This also suppresses both a variation in threshold voltage and a variation in maximum capacitance. As a result, this improves the operation stability of the MIS-type semiconductor device even when the MIS-type semiconductor device is used for electric power control.

The invention may be implemented by any of various aspects: for example, an MIS-type semiconductor device, a manufacturing apparatus of an MIS-type semiconductor device and a power converter including an MIS-type semiconductor.

The invention suppresses a variation in voltage at which the capacitance of the MIS-type semiconductor device abruptly increases (threshold voltage), irrespective of the different voltage range where the applied voltage to the MIS-type semiconductor device is changed and the different direction of such a change. The invention also suppresses a variation in threshold voltage, irrespective of the different frequency of the applied voltage. Accordingly, this improves the operation stability of the MIS-type semiconductor device. The MIS-type semiconductor device herein is not limited to MISFET (Metal Insulator Semiconductor Field Effect Transistor) but has a broader meaning including, for example, a layered product consisting of a substrate, a zirconium oxynitride layer and an electrode layer, where neither a source electrode nor a drain electrode is formed, and the electrode layer is usable as a gate electrode.

BRIEF DESCRIPTION OF THE DRAWINGS

FIG. 3 is a diagram showing execution or non-execution of the second annealing and the third annealing with respect to the samples 1 to 4 of the first example;

FIGS. 7A-7B are diagrams showing the results of CV measurement with respect to the sample 4;

FIG. 8 is a diagram showing execution or non-execution of the second annealing and the third annealing with respect to the sample 5 of the second example;

FIG. 10 is a diagram showing execution or non-execution of the second annealing and the third annealing with respect to the samples 6 to 9 of the third example;

DESCRIPTION OF EMBODIMENTS

A. First Embodiment

A1. Structure of MIS-Type Semiconductor Device

Figure 1:
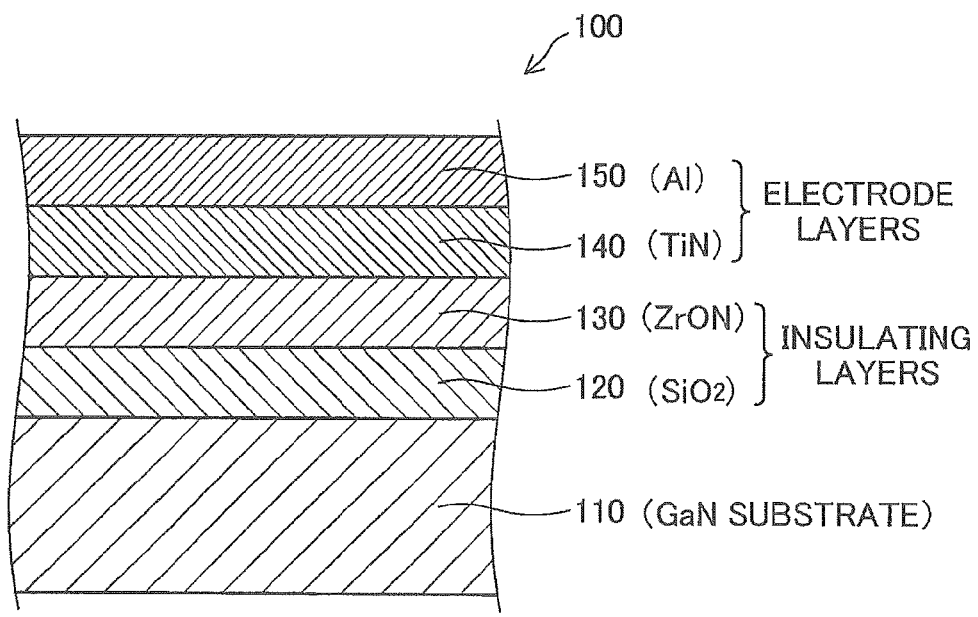
FIG. 1 is a cross sectional view schematically illustrating the structure in the vicinity of a gate electrode of a semiconductor device produced by a manufacturing method according to an embodiment of the invention.

FIG. 1 is a cross sectional view schematically illustrating the structure in the vicinity of a gate electrode of a semiconductor device produced by a manufacturing method according to an embodiment of the invention. A semiconductor device 100 is an MIS-type semiconductor device having MIS (Metal Insulator Semiconductor) structure.

The semiconductor device 100 is a planar semiconductor device having the structure where a substrate layer 110, a first insulating layer 120, a second insulating layer 130, a first electrode layer 140 and a second electrode layer 150 are stacked in this order. The substrate layer 110 is an n-type semiconductor layer containing gallium nitride (GaN) and silicon (Si) as the donor. Using such a semiconductor layer containing GaN enables the semiconductor device 100 to have high-speed switching operations and high frequency operations and to be favorably used as a power semiconductor element. The substrate layer 110 corresponds to the substrate of the claims.

The first insulating layer 120 is formed on the substrate layer 110. The first insulating layer 120 is made of a silicon oxide ($SiO_2$) film. The second insulating layer 130 is formed on the first insulating layer 120. The second insulating layer 130 is made of a high-k insulating material. The first embodiment employs zirconium oxynitride (ZrON) as the high-k insulating material. These two layers, i.e., the first insulating layer 120 and the second insulating layer 130, constitute the insulating layer in the MIS-type semiconductor device. According to the first embodiment, formation of the first insulating layer 120 in addition to the second insulating layer 130 improves the insulation properties.

The first electrode layer 140 is formed on the second insulating layer 130. The first electrode layer 140 is made of titanium nitride (TiN). The second electrode layer 150 is formed on the first electrode layer 140. The second electrode layer 150 is made of aluminum (Al). The first electrode layer 140 and the second electrode layer 150 constitute the electrode layer in the MIS-type semiconductor device and correspond to the electrode layer of the claims.

The semiconductor device 100 of the above structure is produced by a manufacturing method described below to have improved operation stability.

A2. Manufacturing Method of Semiconductor Device

Figure 2:
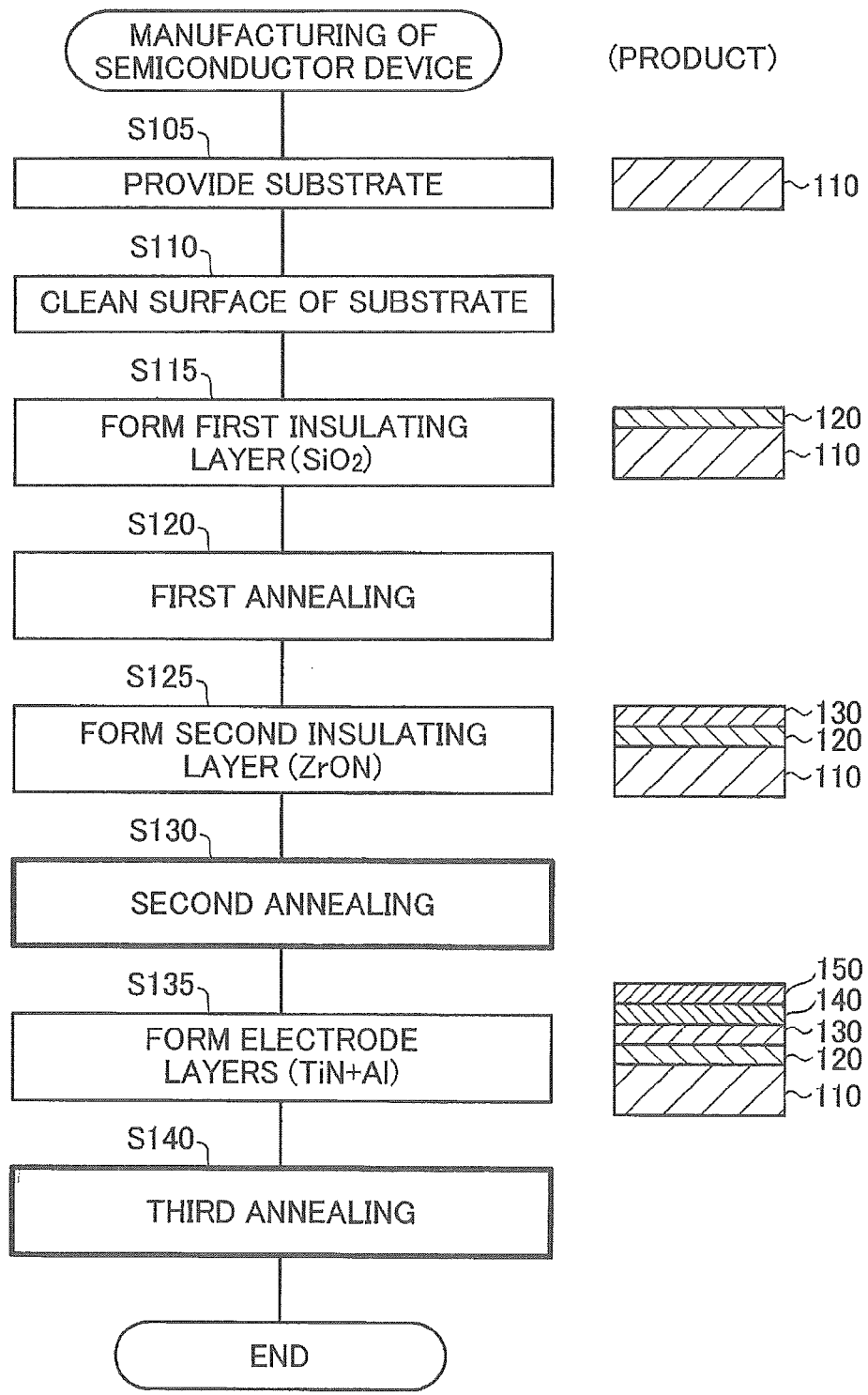
FIG. 2 is a flowchart showing a processing flow of semiconductor manufacturing method according to the first embodiment.

FIG. 2 is a flowchart showing a processing flow of semiconductor manufacturing method according to the first embodiment. The products obtained by the respective processing steps are schematically illustrated on the right side of the relevant steps S105, S115, S125 and S135 in FIG. 2. As shown in FIG. 2, the processing flow first provides a substrate constituting the substrate layer 110 (step S105). For example, a substrate including an n-type GaN layer epitaxially grown by the MOCVD (Metal Organic Chemical Vapor Deposition) method may be employed as the substrate constituting the substrate layer 110.

The processing flow cleans the surface of the substrate provided at step S105 (step S110). Such cleaning aims to remove the oil content on the surface of the substrate. The surface of the substrate may be cleaned, for example, by using acetone, isopropyl alcohol and ultrapure water in this order. Acid cleaning may additionally be performed for the purpose of removing a natural oxide film generated on the surface of the substrate. For example, a 1:1 mixed solution of hydrochloric acid and ultrapure water may be used for such acid cleaning.

The processing flow subsequently forms the first insulating layer 120 on the substrate subjected to the processing of step S110 (step S115). According to the first embodiment, the ALD (Atomic Layer Deposition) method is employed for the processing of step S115 to form a silicon oxide film on the substrate layer 110.

After formation of the first insulating layer 120 on the substrate layer 110, the processing flow performs first annealing (step S120). Any arbitrary annealing technique may be employed for this first annealing: for example, RTA (Rapid Thermal Annealing) using a lamp, annealing using laser, or annealing using furnace core tube-type heat treatment equipment. The temperature condition for the first annealing is preferably not lower than 400 degrees Celsius. The temperature condition herein means the internal temperature of a chamber when RTA is employed for first annealing. After first annealing, it is preferable to remove silicon oxide extended to the rear face of the substrate layer 110. For example, wet etching using BHF (Buffered HF) may be employed for removal of this silicon oxide.

The processing flow subsequently forms the second insulating layer 130 on the first insulating layer 120 (step S125). According to the first embodiment, the sputtering method is employed for the processing of step S125 to form a zirconium oxynitride (ZrON) film as the second insulating layer 130 on the first insulating layer 120. More specifically, PVD (Physical Vapor Deposition) is performed by using argon (Ar), oxygen ($O_2$) and nitrogen ($N_2$) as the process gases and zirconium (Zr) as the target.

After formation of the second insulating layer 130 on the first insulating layer 120, the processing flow performs second annealing (step S130). The method and the condition of second annealing are the same as those of first annealing and are thus not described here.

The processing flow subsequently forms the first electrode layer 140 and the second electrode layer 150 (step S135). The electrode layers 140 and 150 may be formed by, for example, resist patterning by photolithography, subsequent deposition of titanium nitride (TiN) and aluminum (Al) in this order as the metals forming electrodes by the sputtering method and lifting-off.

After formation of the first electrode layer 140 and the second electrode layer 150, the processing flow performs third annealing (step S140). Any arbitrary technique such as RTA may be employed for third annealing as in the case of the first annealing. The temperature condition for the third annealing is preferably not lower than 400 degrees Celsius and not higher than 1000 degrees Celsius. The temperature condition of not higher than 1000 degrees Celsius protects the semiconductor device 100 from being broken.

The semiconductor device 100 of the first embodiment is completed by the above series of processing. An MISFET (Metal Insulator Semiconductor Field-Effect Transistor) may be manufactured by using the completed semiconductor device 100. For example, an n-type MISFET may be manufactured by using the first electrode layer 140 and the second electrode layer 150 as a gate electrode and additionally forming a source electrode and a drain electrode.

In the first embodiment, among the first annealing to the third annealing described above, the first annealing and the second annealing may be omitted.

B. Second Embodiment

A semiconductor device according to a second embodiment differs from the semiconductor device 100 according to the first embodiment in a substrate layer 110 that is an n-type semiconductor layer made of silicon (Si), instead of gallium nitride (GaN), but otherwise has the similar structure to that of the semiconductor device 100 of the first embodiment. The detailed structure of the semiconductor device of the second embodiment is accordingly not described.

A manufacturing method of the semiconductor device according to the second embodiment differs from the manufacturing method of the semiconductor device according to the first embodiment shown in FIG. 2 in step S105 that provides an n-type Si substrate instead of the n-type GaN substrate, but otherwise has the similar processing flow as that of the manufacturing method of the semiconductor device of the first embodiment. The detailed processing flow of the manufacturing method of the semiconductor device of the second embodiment is accordingly not described.

C. Examples

C1. First Example

Two different types of semiconductor devices (sample 1 and sample 2) were manufactured as working examples according to the first embodiment described above. Two different types of semiconductor devices (sample 3 and sample 4) were also produced as comparative examples.

FIG. 3 is a diagram showing execution or non-execution of the second annealing and the third annealing with respect to the samples 1 to 4 of the first example. As shown in FIG. 3, both the second annealing (step S130) and the third annealing (step S140) were performed for manufacturing of the sample 1 as one working example. The second annealing was not performed but the third annealing was performed for manufacturing of the sample 2 as another working example. The second annealing was performed but the third annealing was not performed for manufacturing of the sample 3 as a comparative example. Neither of the second annealing and the third annealing was performed for manufacturing of the sample 4 as another comparative example. The manufacturing methods of the respective samples 1 to 4 had the identical processing flow, other than execution or non-execution of the second annealing and the third annealing described above.

With respect to manufacturing of the respective samples 1 to 4, the formation of the first insulating layer described above (step S115) performed film-forming with the plasma power of 500 W and under the temperature environment of 350 degrees Celsius. The first annealing (step S120) performed RTA. More specifically, the first annealing maintained the inside of the chamber at 400 degrees Celsius under nitrogen atmosphere to continue heating for about 30 minutes. In the formation of the second insulating layer (step S125), the flow rates of the respective process gases were 20.0 sccm for argon gas, 1.0 sccm for oxygen gas and 8.5 sccm for nitrogen gas. The plasma power was 500 W, and the temperature was not controlled but was ambient temperature. The second annealing (step S130) and the third annealing (step S140) performed RTA under the same conditions as those of the first annealing.

Figure 4A:
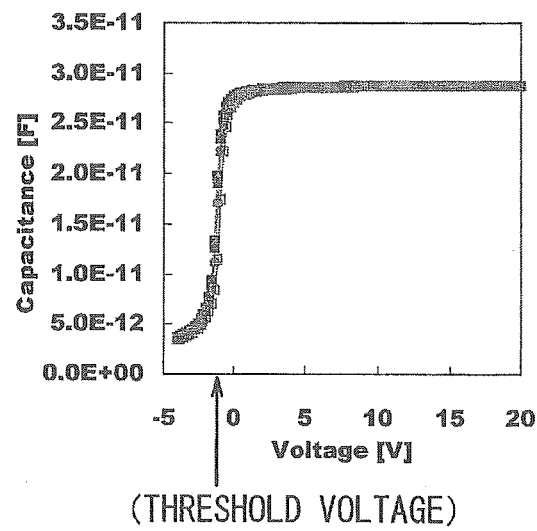
FIGS. 4A-4B are diagrams showing the results of CV measurement with respect to the sample 1.
Figure 4B:
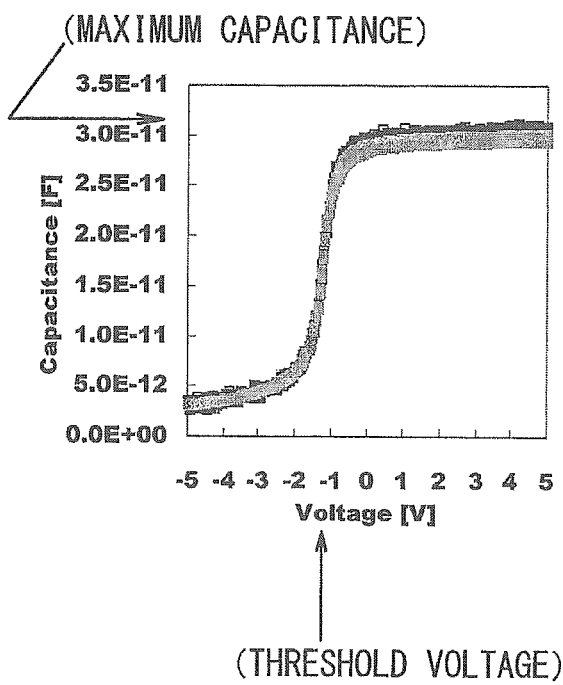
Figure 5A:
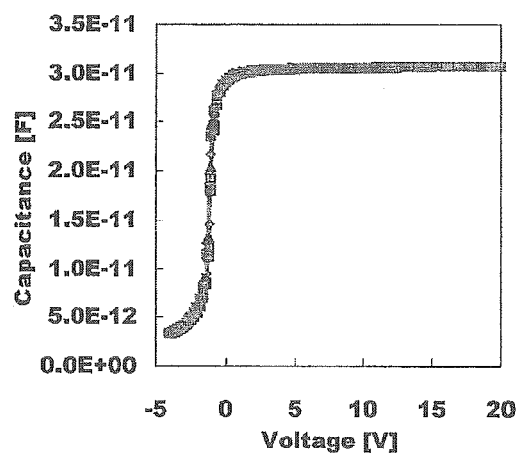
FIGS. 5A-5B are diagrams showing the results of CV measurement with respect to the sample 2.
Figure 5B:
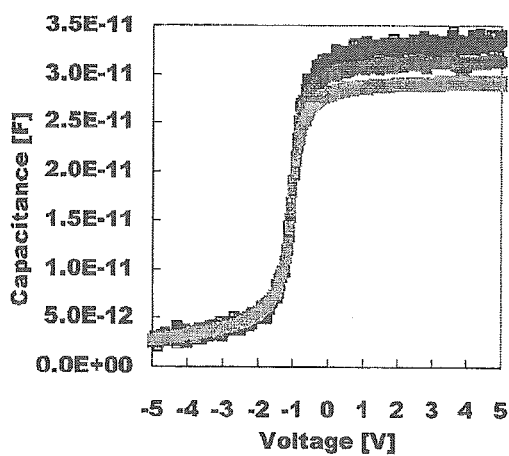
Figure 6A:
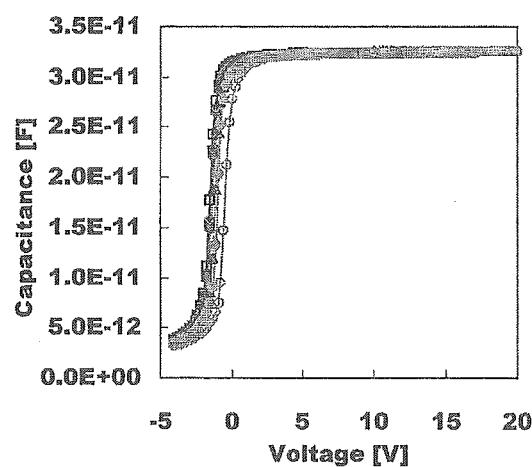
FIGS. 6A-6B are diagrams showing the results of CV measurement with respect to the sample 3.
Figure 6B:
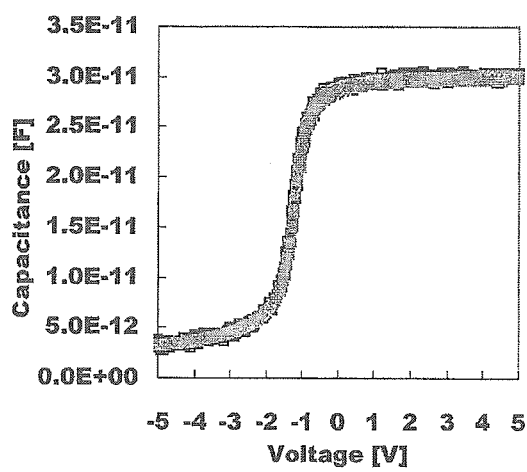

The respective samples 1 to 4 manufactured were subject to CV (capacitance-voltage) measurement. FIGS. 4A-4B are diagrams showing the results of CV measurement with respect to the sample 1. FIGS. 5A-5B are diagrams showing the results of CV measurement with respect to the sample 2. FIGS. 6A-6B are diagrams showing the results of CV measurement with respect to the sample 3. FIGS. 7A-7B are diagrams showing the results of CV measurement with respect to the sample 4. The CV measurement used an LCR meter and measured the capacitance by applying a voltage between the substrate layer 110 and the second electrode layer 150.

In FIGS. 4A to 7B, the upper graph (A) mainly shows the results of a test for evaluating a variation in voltage at which the capacitance abruptly increased (threshold voltage) (hereinafter referred to as "threshold voltage dispersion evaluation test"), and the lower graph (B) mainly shows the results of a test for evaluating a variation in maximum capacitance (hereinafter referred to as "maximum capacitance dispersion evaluation test"). The threshold voltage dispersion evaluation test measured the capacitance with changing the voltage applied to the semiconductor device in a plurality of voltage ranges. This evaluation test was performed both in the case of increasing the applied voltage and in the case of decreasing the applied voltage as the change of the voltage value. More specifically, the applied voltage was changed from −4 V to +5 V, from +5 V to −4 V, from −4 V to +10 V, from +10 V to −4 V, from −4 V to +15 V, from +15 V to −4 V, from −4 V to +20 V, and from +20 V to −4V.

The maximum capacitance dispersion evaluation test changed the frequency of the applied voltage from 1 kHz to 10 kHz, 100 kHz and 1 MHz and measured the capacitance at each of the frequencies with changing the voltage applied to the semiconductor device in a specified voltage range. More specifically, the applied voltage was changed from −5 V to +5 V and from +5 V to −5 V at each of the frequencies. The variation in threshold voltage can also be evaluated from the results of the maximum capacitance dispersion evaluation test.

As shown in FIG. 4A, the threshold voltages of the sample 1 were substantially consistent, irrespective of the different voltage range where the applied voltage was changed and the different direction of the change (increase or decrease). As shown in FIG. 4B, the threshold voltages of the sample 1 were substantially consistent, irrespective of the different frequency of the applied voltage. Accordingly, the variation in threshold voltage of the sample 1 was smaller than the variation in threshold voltage of the comparative example (sample 3) shown in FIGS. 6A-6B or the variation in threshold voltage of the comparative example (sample 4) shown in FIGS. 7A-7B.

As shown in FIG. 4B, the maximum capacitances of the sample 1 were substantially consistent, irrespective of the different frequency. Accordingly, the variation in maximum capacitance of the sample 1 was equivalent to or smaller than the variation in maximum capacitance of the comparative example (sample 3) shown in FIG. 6B or the variation in maximum capacitance of the comparative example (sample 4) shown in FIG. 7B.

As shown in FIG. 5A, the threshold voltages of the sample 2 were substantially consistent, irrespective of the different voltage range where the applied voltage was changed and the different direction of the change (increase or decrease). As shown in FIG. 5B, the threshold voltages were substantially consistent, irrespective of the different frequency of the applied voltage. Accordingly, the variation in threshold voltage of the sample 2 was smaller than the variation in threshold voltage of the comparative example (sample 3) shown in FIGS. 6A-6B or the variation in threshold voltage of the comparative example (sample 4) shown in FIGS. 7A-7B.

These results indicate that the sample 1 and the sample 2 for which at least the third annealing is performed have the reduced variation in threshold voltage, compared with the sample 3 and the sample 4 of the comparative examples. Accordingly, when the sample 1 and the sample 2 constitute transistors and the same gate voltage is applied a plurality of times, it is highly probable that only either one of the ON operation and the OFF operation is performed in either case. This improves the operation stability of the semiconductor device.

Additionally, as shown in FIG. 7B, the sample 4 of the comparative example had a relatively large variation in maximum capacitance at a relatively large applied voltage (for example, at the applied voltage of +5 V). As shown in FIG. 4B, on the other hand, the sample 1 had a relatively small variation in maximum capacitance even at the relatively large applied voltage. Accordingly, even when the semiconductor device 100 is used as a semiconductor element having the higher operation voltage than the operation voltage as a CMOS (Complementary Metal Oxide Semiconductor), this improves the operation stability. In other words, using the semiconductor device 100 as a power semiconductor element such as FET (Field Effect Transistor), HFET (hetero-FET) or IGBT (Insulated Gate Bipolar Transistor) ensures the more significant advantageous effects of the invention.

C2. Second Example

One semiconductor device (sample 5) was manufactured as a working example according to the first embodiment described above. The second example differs from the first example in the temperature of the third annealing (step S140) controlled to 700 degrees Celsius, but otherwise has the similar procedure to that of the first embodiment. The sample 5 manufactured was subjected to CV measurement. The treatment time (heating time) of the third annealing was 5 minutes.

FIG. 8 is a diagram showing execution or non-execution of the second annealing and the third annealing with respect to the sample 5 of the second example. The second annealing was not performed but the third annealing was performed for production of the sample 5. The CV measurement method of the second embodiment is identical with that of the first embodiment and is thus not described here.

Figure 9A:
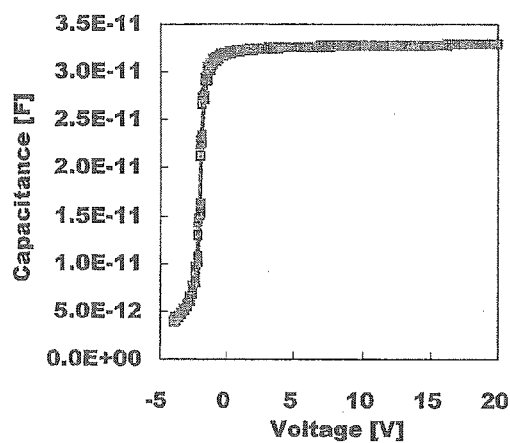
FIGS. 9A-9B are diagrams showing the results of CV measurement with respect to the sample 5 of the second example.
Figure 9B:
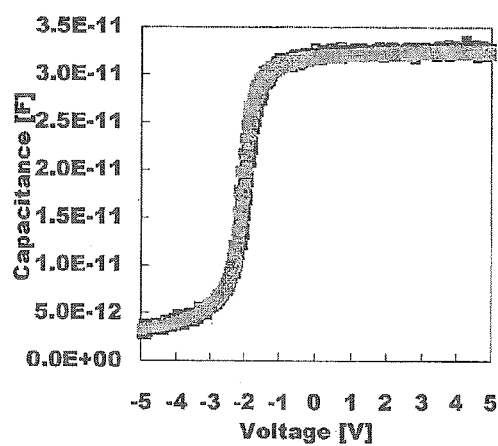

FIGS. 9A-9B are diagrams showing the results of CV measurement with respect to the sample 5 of the second example. Like FIG. 4A, FIG. 9A mainly shows the results of the threshold voltage dispersion evaluation test with respect to the sample 5. Like FIG. 4B, FIG. 9B mainly shows the results of the maximum capacitance dispersion evaluation test with respect to the sample 5.

As shown in FIG. 9A, like the test results of the sample 1 shown in FIG. 4A, the threshold voltages of the sample 5 were substantially consistent, irrespective of the different voltage range where the applied voltage was changed and the different direction of the change (increase or decrease). As shown in FIG. 9B, like the test results of the sample 1 shown in FIG. 4B, the threshold voltages of the sample 5 were substantially consistent, irrespective of the different frequency of the applied voltage. As shown in FIG. 9B, like the test results of the sample 1 shown in FIG. 4B, the maximum capacitances of the sample 5 were substantially consistent, irrespective of the different frequency of the applied voltage.

As described above, the sample 5 of the second example has the similar advantageous effects to those of the samples 1 and 2 of the first example. As understood from the first example and the second example described above, it is preferable to set an arbitrary temperature in the temperature range of not lower than 400 degrees Celsius and not higher than 1000 degrees Celsius as the temperature environment for the third annealing.

C3. Third Example

Two different types of semiconductor devices (sample 6 and sample 7) were manufactured as working examples according to the second embodiment described above. Two different types of semiconductor devise (sample 8 and sample 9) were also manufactured as comparative examples.

FIG. 10 is a diagram showing execution or non-execution of the second annealing and the third annealing with respect to the samples 6 to 9 of the third example. As shown in FIG. 10, both the second annealing and the third annealing were performed for manufacturing of the sample 6 as one working example. The second annealing was not performed but the third annealing was performed for manufacturing of the sample 7 as another working example. The second annealing was performed but the third annealing was not performed for manufacturing of the sample 8 as a comparative example. Neither of the second annealing and the third annealing was performed for manufacturing of the sample 9 as another comparative example. The manufacturing methods of the respective samples 6 to 9 had the identical processing flow, other than execution or non-execution of the second annealing and the third annealing described above.

Figure 11A:
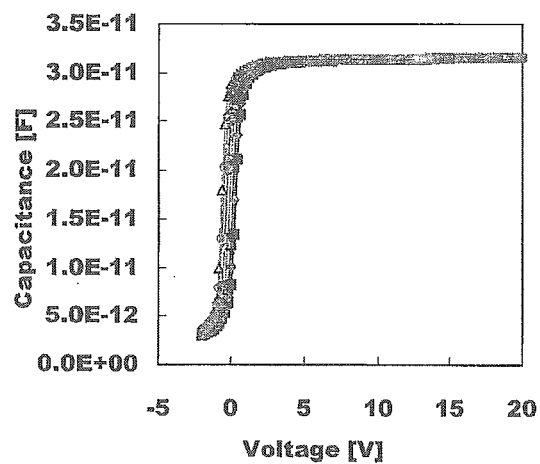
FIGS. 11A-11B are diagrams showing the results of CV measurement with respect to the sample 6 of the third example.
Figure 11B:
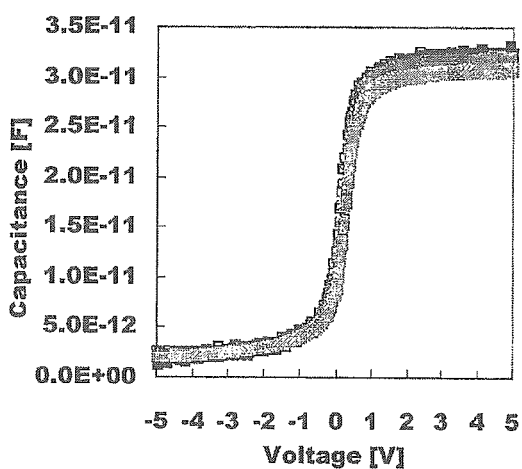
Figure 12A:
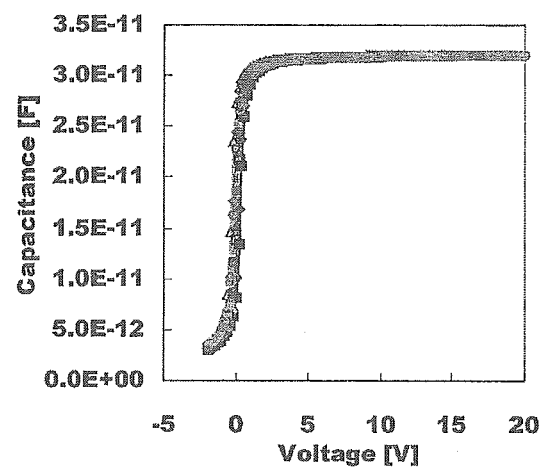
FIGS. 12A-12B are diagrams showing the results of CV measurement with respect to the sample 7of the third example.
Figure 12B:
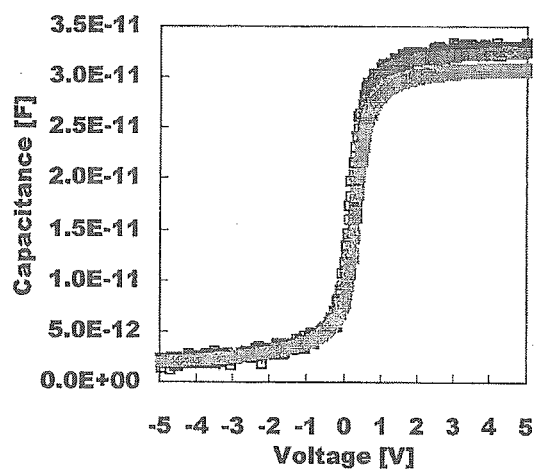
Figure 13A:
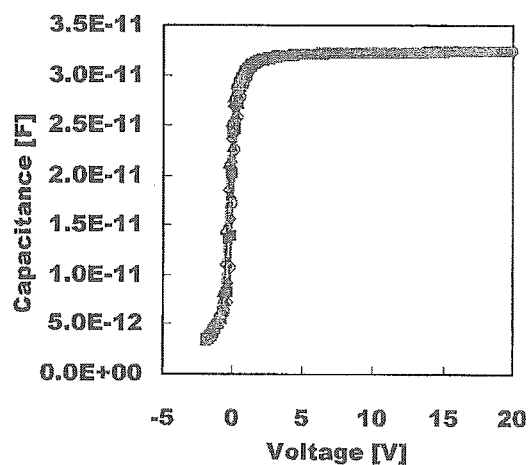
FIGS. 13A-13B are diagrams showing the results of CV measurement with respect to the sample 8 of the third example.
Figure 13B:
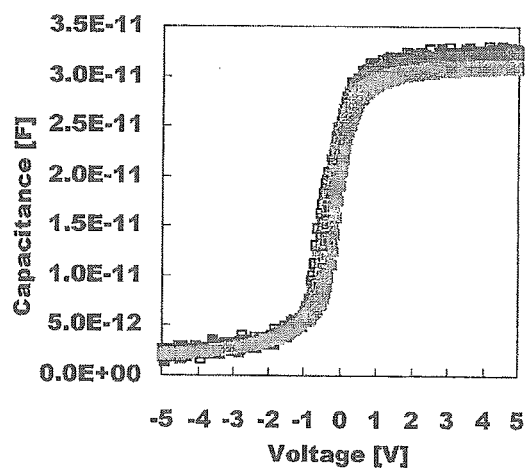
Figure 14A:
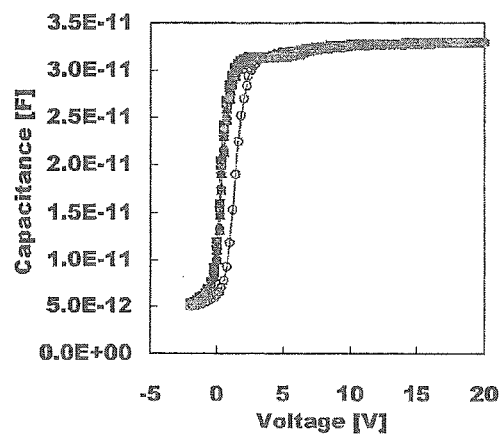
FIGS. 14A-14B are diagrams showing the results of CV measurement with respect to the sample 9 of the third example.
Figure 14B:
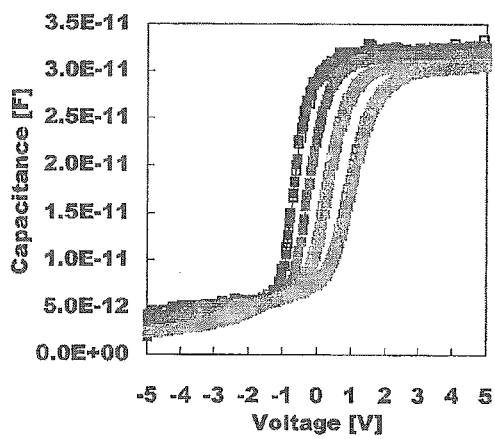

FIGS. 11A-11B are diagrams showing the results of CV measurement with respect to the sample 6 of the third example. FIGS. 12A-12B are diagrams showing the results of CV measurement with respect to the sample 7 of the third example. FIGS. 13A-13B are diagrams showing the results of CV measurement with respect to the sample 8 of the third example. FIGS. 14A-14B are diagrams showing the results of CV measurement with respect to the sample 9 of the third example. In FIGS. 11A to 14B, like FIG. 4A, the upper graph A mainly shows the results of the threshold voltage dispersion evaluation test with respect to the samples 6 to 9, and the lower graph B mainly shows the results of the maximum capacitance dispersion evaluation test with respect to the samples 6 to 9.

As shown in FIG. 11A, the threshold voltages of the sample 6 were substantially consistent, irrespective of the different voltage range where the applied voltage was changed and the different direction of the change (increase or decrease). As shown in FIG. 11B, the threshold voltages of the sample 6 were substantially consistent, irrespective of the different frequency of the applied voltage. Accordingly, the variation in threshold voltage of the sample 6 was smaller than the variation in threshold voltage of the sample 8 as the comparative example shown in FIG. 13B or the variation in threshold voltage of the sample 9 as the comparative example shown in FIGS. 14A and 14B.

As shown in FIG. 11B, the variation in maximum capacitance of the sample 6 was equivalent to the variation in maximum capacitance of the sample 8 shown in FIG. 13B and the variation in maximum capacitance of the sample 9 shown in FIG. 14B.

As shown in FIG. 12A, the threshold voltages of the sample 7 were substantially consistent, irrespective of the different voltage range where the applied voltage was changed and the different direction of the change (increase or decrease). As shown in FIG. 12B, the threshold voltages of the sample 7 were substantially consistent, irrespective of the different frequency of the applied voltage. Accordingly, the variation in threshold voltage of the sample 7 was smaller than the variation in threshold voltage of the sample 8 shown in FIGS. 13A-13B or the variation in threshold voltage of the sample 9 shown in FIGS. 14A-14B.

As shown in FIG. 12B, the variation in maximum capacitance of the sample 7 was equivalent to the variation in maximum capacitance of the sample 8 shown in FIG. 13B and the variation in maximum capacitance of the sample 9 shown in FIG. 14B.

These results indicate that the sample 6 and the sample 7 for which at least the third annealing is performed have the reduced variation in threshold voltage, compared with the sample 8 and the sample 9 of the comparative examples. Accordingly, when the sample 6 and the sample 7 constitute transistors and the same gate voltage is applied a plurality of times, only either one of the ON operation and the OFF operation is performed in either case. This improves the operation stability of the semiconductor device.

D. Modifications

D1. Modification 1

Figure 15:
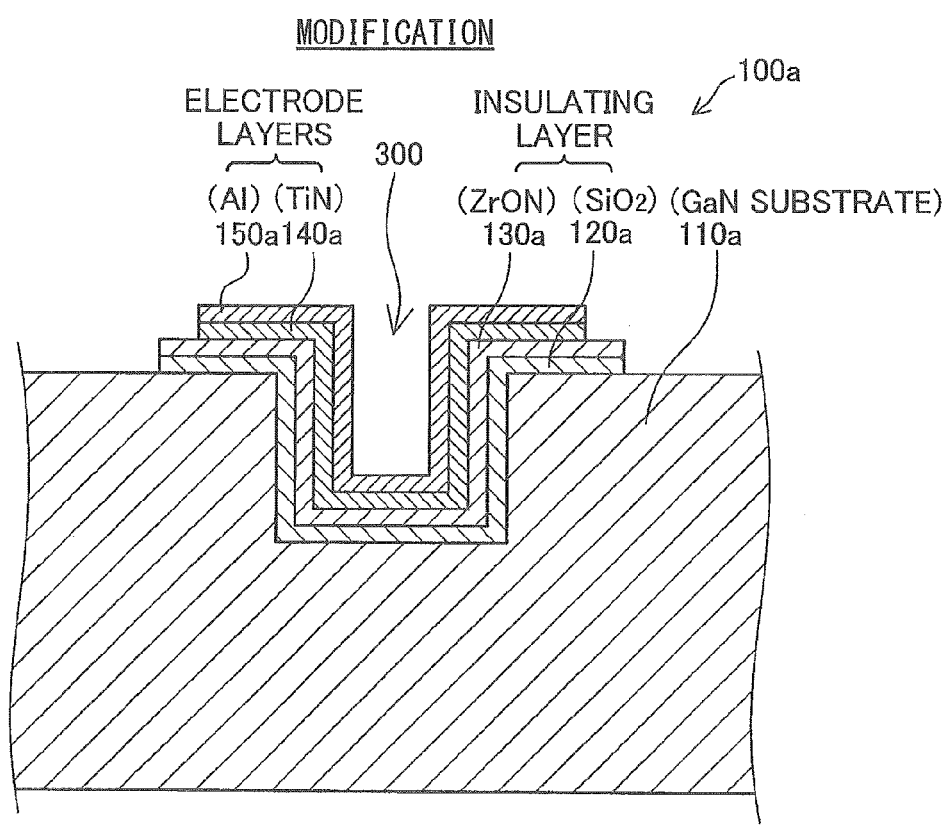
FIG. 15 is a cross sectional view schematically illustrating the structure of a semiconductor device according to Modification 1.

FIG. 15 is a cross sectional view schematically illustrating the structure of a semiconductor device according to Modification 1. The semiconductor devices according to the respective embodiments and the respective examples are all planar semiconductor devices, but the invention is not limited to the planar type but is also applicable to the manufacturing method of trench semiconductor devices.

As shown in FIG. 15, a semiconductor device 100a of Modification 1 is a trench semiconductor device (MIS-type semiconductor device) and has a trench 300 extended from an electrode surface to a GaN substrate (n-GaN). The semiconductor device 100a includes a substrate layer 110a, a first insulating layer 120a, a third insulating layer 130a, a first electrode layer 140a and a second electrode layer 150a. Like the substrate 110, the substrate 110a is an n-type semiconductor layer containing gallium nitride (GaN) and silicon (Si) as the donor. Like the first insulating layer 120, the first insulating layer 120a is a silicon oxide (SiO₂) layer formed on the substrate layer 110a. Like the second insulating layer 130, the second insulating layer 130a is a zirconium oxynitride (ZrON) layer formed on the first insulating layer 120a. Like the first electrode layer 140, the first electrode layer 140a is a titanium nitride (TiN) layer formed on the second insulating layer 130a. Like the second electrode layer 150, the second electrode layer 150a is an aluminum (Al) layer formed on the first electrode layer 140a.

The semiconductor device 100a of the above structure may be produced by the similar manufacturing method to that of the first embodiment described above. More specifically, for example, the procedure may perform an etching step to dig through the substrate layer 110a between steps S105 and S110 and subsequently perform the respective steps (steps S110 to S140) to form the trench 300. In the manufacturing of this semiconductor device 100a, performing at least the third annealing (PMA) has the similar advantageous effects to those of the respective embodiments and the respective examples described above.

The cross sectional geometry of the trench 300 may be set arbitrarily: for example, a rectangular geometry having side faces that are parallel in the stacking direction as shown in FIG. 15, a trapezoidal geometry or a wedge geometry having side faces that are not parallel in the stacking direction, or a partly circular geometry or a partly elliptical geometry. The bottom geometry of the trench 300 may also be set arbitrarily: for example, a rectangular geometry, a polygonal geometry, a circular geometry or an elliptical geometry.

D2. Modification 2

Although the second annealing is executed or not executed arbitrarily according to the first embodiment, but it is preferable to perform the second annealing. For example, comparison between the sample 1 of the first example that performed the second annealing and the sample 2 that did not perform the second annealing indicate that the variation in maximum capacitance of the sample 1 is smaller than the variation in maximum capacitance of the sample 2 as shown in FIGS. 4A-4B and 5A-5B.

D3. Modification 3

The first insulating layer 120 is made of silicon oxide (SiO₂) in the respective embodiments, but may be provided as any silicon (Si)-containing layer including, for example, silicon oxynitride (SiON) or silicon nitride (SiN), instead of silicon oxide. In other words, the invention may generally employ a step of forming a zirconium oxynitride (ZrON) layer on a silicon (Si)-containing layer.

D4. Modification 4

The second electrode layer 150 is made of aluminum in the respective embodiments, but may be made of an aluminum alloy, instead of aluminum. The second electrode layer 150 may be omitted in the respective embodiments. In other words, the invention may generally employ a step of forming a titanium nitride (TiN)-containing electrode layer on a zirconium oxynitride (ZrON) layer.

D5. Modification 5

The substrate layer 110 is an n-type semiconductor layer in the respective embodiments, but may be a p-type semiconductor layer. In the latter case, for example, a p-type MISFET may be manufactured by using a semiconductor device manufactured by the manufacturing method of the respective embodiments.

The invention is not limited to the above embodiments, examples or modifications, but a diversity of variations and modifications may be made to the embodiments without departing from the scope of the invention. For example, the technical features of the embodiments, examples or modifications corresponding to the technical features of the respective aspects described in SUMMARY OF INVENTION may be replaced or combined appropriately, in order to solve part or all of the problems described above or in order to achieve part or all of the advantageous effects described above. Any of the technical features may be omitted appropriately unless the technical feature is described as essential herein.

What is claimed is:
1. A manufacturing method of an MIS (Metal Insulator Semiconductor)-type semiconductor device, comprising:
    forming a zirconium oxynitride (ZrON) layer;
    forming an electrode layer containing titanium nitride (TiN) on a surface of the zirconium oxynitride (ZrON) layer and in contact with the surface of the zirconium oxynitride (ZrON) layer;
    heating the electrode layer; and
    heating the zirconium oxynitride (ZrON) layer, after the forming of the zirconium oxynitride (ZrON) layer and prior to the forming of the electrode layer containing titanium nitride (TiN) on the surface of the zirconium oxynitride (ZrON) layer.
2. The manufacturing method of the MIS-type semiconductor device according to claim 1, further comprising:
    forming a silicon (Si)-containing layer on a substrate, prior to the forming of the zirconium oxynitride (ZrON) layer,
    wherein the forming of the zirconium oxynitride (ZrON) layer forms the zirconium oxynitride (ZrON) layer on the silicon (Si)-containing layer.
3. The manufacturing method of the MIS-type semiconductor device according to claim 1, wherein the heating the electrode layer heats the electrode layer at a temperature that is equal to or higher than 400 degrees Celsius and equal to or lower than 1000 degrees Celsius.
4. The manufacturing method of the MIS-type semiconductor device according to claim 1, wherein the heating of the zirconium oxynitride (ZrON) layer heats the zirconium oxynitride (ZrON) layer at a temperature that is equal to or higher than 400 degrees Celsius.
5. The manufacturing method of the MIS-type semiconductor device according to claim 1, further comprising:
    forming a silicon (Si)-containing layer on a substrate, prior to the forming of the zirconium oxynitride (ZrON) layer,
    wherein the substrate contains gallium nitride (GaN).
6. The manufacturing method of the MIS-type semiconductor device according to claims 1, further comprising:
    forming a silicon (Si)-containing layer on a substrate, prior to the forming of the zirconium oxynitride (ZrON) layer; and
    heating the silicon (Si)-containing layer, after the forming of the silicon (Si)-containing layer on a substrate and prior to the forming of the zirconium oxynitride (ZrON) layer.
7. The manufacturing method of the MIS-type semiconductor device according to claim 6, wherein the heating of the silicon (Si)-containing layer heats the silicon (Si)-containing layer at a temperature that is equal to or higher than 400 degrees Celsius.

8. The manufacturing method of the MIS-type semiconductor device according to claim 1, wherein the MIS-type semiconductor device is used for electric power control.

9. A method of manufacturing a semiconductor device, comprising:
    forming a first insulating layer on a substrate;
    after the forming of the first insulating layer, performing a first annealing;
    forming a second insulating film comprising a zirconium oxynitride (ZrON) film on the first insulating layer;
    after the forming of the second insulating layer, performing a second annealing; and
    after the performing of the second annealing, forming an electrode layer on a surface of the second insulating film and in contact with the surface of the second insulating film.

10. The manufacturing method of the MIS-type semiconductor device according to claim 9, wherein the first annealing comprises one of Rapid Thermal Annealing (RTA) using a lamp, annealing using laser, and annealing using furnace core tube-type heat treatment equipment.

11. The manufacturing method of the MIS-type semiconductor device according to claim 9, wherein the first annealing is performed in a chamber and an internal temperature of the chamber during the first annealing is not less than 400° C.

12. The manufacturing method of the MIS-type semiconductor device according to claim 9, wherein the forming of the ZrON film is performed by sputtering.

13. The manufacturing method of the MIS-type semiconductor device according to claim 9, wherein the forming of the ZrON film is performed by physical vapor deposition (PVD) by using argon (Ar), oxygen ($O_2$) and nitrogen ($N_2$) as process gases and zirconium (Zr) as a target.

14. The manufacturing method of the MIS-type semiconductor device according to claim 9, wherein a process condition in the first annealing is the same as a process condition in the second annealing.

15. The manufacturing method of the MIS-type semiconductor device according to claim 9, further comprising:
    after the forming of the electrode layer, performing a third annealing at a temperature which is not less than 400° C. and not greater than 1000° C.

16. The manufacturing method of the MIS-type semiconductor device according to claim 9, wherein the forming of the electrode layer comprises:
    forming a first electrode layer including titanium nitride on the second insulating film; and
    forming a second electrode layer including aluminum on the first electrode layer.

17. The manufacturing method of the MIS-type semiconductor device according to claim 9, wherein the semiconductor device comprises an n-type Metal Insulator Semiconductor Field-Effect Transistor (MISFET) comprising a gate electrode which includes the first electrode layer and the second electrode layer.

* * * * *